(12) United States Patent  
Paskalova (10) Patent No.: US 10,388,494 B2  
(45) Date of Patent: Aug. 20, 2019

(54) THREE-DIMENSIONAL PLASMA PRINTER

(71) Applicant: KYOCERA Document Solutions Inc., Osaka (JP)

(72) Inventor: Svetlana Paskalova, Torrance, CA (US)

(73) Assignee: KYOCERA DOCUMENT SOLUTIONS INC., Osaka (JP)

(*) Notice: Subject to any disclaimer, the term of this patent is extended or adjusted under 35 U.S.C. 154(b) by 595 days.

(21) Appl. No.: 15/057,635

(22) Filed: Mar. 1, 2016

(65) Prior Publication Data

US 2017/0256385 A1  Sep. 7, 2017

(51) Int. Cl.
| | |
|---|---|
| *H05H 1/42* | (2006.01) |
| *H01J 37/32* | (2006.01) |
| *B28B 1/00* | (2006.01) |
| *B33Y 10/00* | (2015.01) |
| *B33Y 30/00* | (2015.01) |
| *B33Y 50/02* | (2015.01) |
| *B23K 10/02* | (2006.01) |

(52) U.S. Cl.
CPC ...... *H01J 37/32926* (2013.01); *B23K 10/027* (2013.01); *B28B 1/001* (2013.01); *B33Y 10/00* (2014.12); *B33Y 30/00* (2014.12); *B33Y 50/02* (2014.12); *H01J 37/321* (2013.01); *H01J 37/3244* (2013.01); *H01J 37/32055* (2013.01); *H01J 37/32091* (2013.01); *H01J 37/32458* (2013.01); *H05H 1/42* (2013.01)

(58) Field of Classification Search
CPC ........ B33Y 10/00; B33Y 30/00; B33Y 50/02; B23K 10/027; B28B 1/001; H01J 37/32055; H01J 37/32091; H01J 37/321; H01J 37/3244; H01J 37/32458; H05H 1/42
USPC ...... 219/69.17, 74, 76.1, 76.11, 76.14, 76.16
See application file for complete search history.

(56) References Cited

U.S. PATENT DOCUMENTS

| | | |
|---|---|---|
| 8,827,684 B1 | 9/2014 | Schumacher et al. |
| 2006/0057016 A1* | 3/2006 | Kumar .................... C23C 26/00 419/56 |

* cited by examiner

*Primary Examiner* — Phuong T Nguyen  
(74) *Attorney, Agent, or Firm* — McDonnell Boehnen Hulbert & Berghoff LLP (57) ABSTRACT

In one aspect, a method is described. The method may include ionizing a plasma gas to generate a plasma in a plasma source and accelerating the plasma toward a work surface. The method may further include adding a material to the plasma, thereby melting the material and accelerating the melted material toward the work surface. The method may further include depositing successive layers of the melted material on the work surface to form a three-dimensional object. Each of the successive layers may correspond to one of a number of planar slices of the three-dimensional object.

21 Claims, 7 Drawing Sheets

THREE-DIMENSIONAL PLASMA PRINTER

BACKGROUND

As computer-aided manufacturing has progressed, three-dimensional (3D) printing technology has developed to rapidly convert original design concepts into physical models. A common technique for 3D printing involves additive manufacturing, in which successive layers of a material may be formed on top of each other. Each of the successive layers may correspond with a cross-sectional layer of a 3D object, so that the complete stack of successive layers forms the 3D object.

Typically, the successive layers may be formed from a resin with a low melting point. However, systems that utilize resin may require heating elements to prevent the resin from cooling down too quickly and prematurely curing. Additionally, these systems may require the temperature of the print head to be carefully maintained.

Other 3D printing systems may use laser sintering to selectively fuse together successive layers of powdered waxes. However, laser systems have a very narrow working area due to the small beam size of the laser. This often requires the laser to be scanned over a large area, increasing overall print times.

SUMMARY

In one aspect, a method is described. The method may include ionizing a plasma gas to generate a plasma in a plasma source and accelerating the plasma toward a work surface. The method may further include adding a material to the plasma, thereby melting the material and accelerating the melted material toward the work surface. The method may further include depositing successive layers of the melted material on the work surface to form a three-dimensional object.

In a further aspect, a system is described. The system may include a work surface as well as a plasma source configured to generate a plasma by ionizing a plasma gas and further configured to accelerate the plasma toward the work surface. The system may further include a feeder configured to add a material to the plasma, where the material is melted by the plasma and accelerated toward the work surface. The system may further include a controller configured to adjust the relative position of the plasma to the work surface in order to deposit successive layers of the melted material on the work surface.

In a further aspect, an apparatus is described. The apparatus may be a printing head apparatus for fabricating a three-dimensional object, and the apparatus may include a first inlet configured to receive a plasma gas. The apparatus may further include a plasma source configured to ionize the plasma gas to generate a plasma. The plasma source may include an anode and a cathode configured to generate a direct current arc plasma, a coil configured to generate an inductively coupled plasma, and capacitive electrodes configured to generate a capacitively coupled plasma. Further, the plasma source may be configured to accelerate the plasma toward a work surface. The apparatus may further include a second inlet configured to receive a powdered printing material and add the powdered printing material to the plasma, where the powdered printing material is melted and deposited on the work surface to form a three-dimensional object.

These as well as other aspects, advantages, and alternatives will become apparent to those of ordinary skill in the art by reading the following detailed description with reference where appropriate to the accompanying drawings. Further, it should be understood that the description provided in this summary section and elsewhere in this document is intended to illustrate the claimed subject matter by way of example and not by way of limitation.

DETAILED DESCRIPTION

Example methods and systems are described herein. Other example embodiments or features may further be utilized, and other changes may be made, without departing from the scope of the subject matter presented herein. In the following detailed description, reference is made to the accompanying figures, which form a part thereof The example embodiments described herein are not meant to be limiting. Thus, aspects of the present disclosure, as generally described herein and illustrated in the figures, can be arranged, substituted, combined, separated, and designed in a wide variety of different configurations, all of which are explicitly contemplated herein.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

I. Overview

Illustrative embodiments relate to example three-dimensional (3D) plasma printers and corresponding control methods. The control methods may be used to operate the 3D plasma printer to fabricate 3D objects.

In an example arrangement, a 3D plasma printer may be embodied as a plasma source configured to generate a plasma and accelerate printing material in a plasma jet toward a work surface.

In an example control method for the example arrangement, the 3D plasma printer may deposit successive layers of the printing material on the work surface. Each of the successive layers corresponds with a planar cross-section of a 3D object. By depositing the successive layers on top of one another, the 3D plasma printer may fabricate the 3D object from the printing material.

It should be understood that the above examples are provided for illustrative purposes, and should not be construed as limiting. As such, the method may additionally or alternatively include other features or include fewer features, without departing from the scope of the invention.

II. Example Systems and Methods

Figure 1:
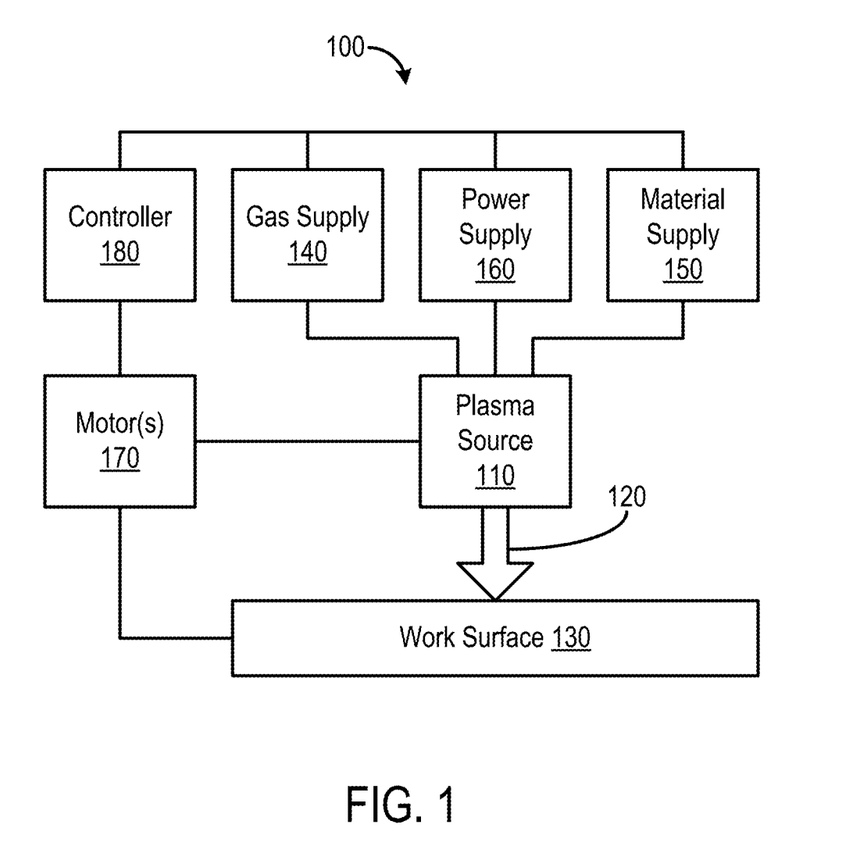
FIG. 1 depicts a block diagram of a 3D plasma printing system, according to an example embodiment.

FIG. 1 depicts a block diagram of a 3D plasma printing system 100 according to an example embodiment. In particular, the 3D plasma printing system 100 includes a plasma source 110, a work surface 130, a gas supply 140, a material supply 150, a power supply 160, one or more motors 170, and a controller 180. The 3D plasma printing system 100 may be configured to fabricate a 3D object on the work surface 130. The work surface 130 may include a platform on which a 3D object is to be fabricated, and/or the work surface 130 may include a 3D object itself.

In operation, the plasma source 110 may generate a plasma and accelerate the plasma as a plasma jet 120 toward the work surface 130. To generate the plasma, the plasma source 110 may ionize a gas from the gas supply 140. The gas from the gas supply 140 may include a noble gas, oxygen, nitrogen, air, a reduced gas, or any other gas suitable for generating the plasma. Further, the gas supply 140 may supply the plasma source 110 with more than one gas at a time. The plasma source 110 may contain the gas in a pressurized housing. The gas may be pressurized at a pressure below atmospheric pressure, above atmospheric pressure, or equal to atmospheric pressure.

To ionize the gas, the plasma source 110 may include various electrodes. For example, the plasma source 110 may include an anode and a cathode for generating a direct current (DC) arc plasma, capacitive electrodes for generating a capacitively coupled plasma, and/or a coil for generating an inductively coupled plasma. The power supply 160 may bias the various electrodes in the plasma source 110 in order to ionize the gas. For example, the power supply 160 may provide a high voltage DC bias across the anode and cathode, and the power supply 160 may supply a radio frequency voltage signal to the capacitive electrodes and/or to the coil.

The plasma source 110 may be configured to generate a plasma with a variable temperature. For example, the plasma source 110 may be capable of generating a plasma with a temperature in the range of 300 K to 6,000 K.

The plasma source 110 may be configured to accelerate the plasma toward the work surface 130. For example, the cathode may include an opening, and the electric field generated by the voltage bias across the anode and cathode may accelerate the plasma through the cathode opening. The plasma may be accelerated out of the plasma source 110 as a plasma jet 120.

In some embodiments, the plasma source 110 may be a commercial atmospheric plasma jet-flow system, such as the GSL1100X-PJF.

The material supply 150 may provide printing material to be added to the plasma generated by the plasma source 110. The printing material may take the form of a powder and may include various materials, such as ceramics (e.g., aluminum oxide, zirconium oxide stabilized by yttrium oxide or calcium oxide, silicon dioxide, etc.), metals (e.g., tungsten, titanium, molybdenum, etc.), composite materials (e.g., tungsten carbide-cobalt, titanium carbide, etc.), and/or any combination thereof. The printing material may take other forms as well, such as gases used for plasma-assisted deposition (e.g., $H_2$ and $CH_4$ for diamond deposition).

The printing material may be added to the plasma, either inside the plasma source 110 or to the plasma jet 120 outside the plasma source 110. The plasma source 110 may be configured so that the temperature of the plasma is higher than a melting point of the printing material. When the printing material is added to the plasma, the printing material may be melted by the plasma and accelerated with the plasma toward the work surface 130. The melted printing material may adhere to the work surface 130 where it may cool and solidify. In some embodiments, before adding the printing material to the plasma, the work surface 130 may be exposed to the plasma jet 120 in order to pre-treat, or heat, the work surface 130. This may allow for better deposition of certain printing materials that may adhere more effectively to surfaces at elevated temperatures.

The one or more motors 170 may be configured to adjust the relative position of the plasma jet 120 and the work surface 130. In some embodiments, the work surface 130 may be stationary, and the one or more motors 170 may be configured to adjust the position of the plasma source 110. In other embodiments, the plasma source 110 may be stationary, and the one or more motors 170 may be configured to adjust the position of the work surface 130. Still in other embodiments, the one or more motors 170 may be configured to adjust both the position of the plasma source 110 and the work surface 130.

The one or more motors 170 may take on various configurations and may include DC motors, stepper motors, and/or servo motors, among others. In some embodiments, the one or more motors 170 may be configured to adjust the azimuth of the work surface 130 with respect to the plasma jet 120, for example, by rotating the work surface 130. In some embodiments, the one or more motors 170 may be configured to adjust the relative position of the plasma jet 120 and the work surface 130 by moving the plasma source 110 and/or the work surface 130 along x-, y-, and z-axes.

By adjusting the relative position of the plasma jet 120 and the work surface 130, the melted printing material may be deposited on the work surface in successive layers, and the successive layers may form a fabricated 3D object. The 3D object may be fabricated by depositing the printing material in stacked layers corresponding to a number of cross-sectional slices of the 3D object, as discussed in more detail below with respect to FIG. 4.

In some embodiments, the 3D plasma printing system 100 may be configured to apply a thermal spray coating to a real-world object on the work surface 130. Rather than fabricating a 3D object from scratch, the 3D plasma printing system 100 may deposit the melted printing material (e.g., metals, alloys, ceramics, plastics, composites, etc.) as a coating on the real-world object. The thermal spray coating may provide protection against high temperatures, corrosion, erosion, wear, etc. It may also change the appearance, change the electrical or tribological properties of the surface, replace worn material, etc.

In some embodiments, the 3D plasma printing system 100 may be configured to etch a surface of a 3D object on the work surface 130. By exposing the 3D object to the plasma jet 120 without adding printing material to the plasma, the plasma may etch away particles at the surface of the 3D object. Plasma etching may be used to clean surfaces, for example by removing an oxide layer, alter surface textures, and/or process semiconductor materials, among other uses. Further, by utilizing plasma etching, the 3D plasma printing system 100 may employ subtractive manufacturing techniques to fabricate 3D objects, unlike conventional 3D printers, which are limited to additive techniques.

In some embodiments, the 3D plasma printing system 100 may be configured to sputter a surface of a 3D object on the work surface 130. Sputtering is a process in which particles are ejected from a solid target material due to bombardment of the target by the plasma ions. The plasma source 110 may be configured to accelerate the plasma toward a target material proximal to the 3D object. The target material may include a metal, an alloy, an oxide, various compounds, or any other material suitable for sputtering. By bombarding the target material with the plasma from the plasma source 110, the target material may be sputtered onto the 3D object. This process may be used, for example, to deposit a thin layer of the target material on the 3D object.

Figure 3:
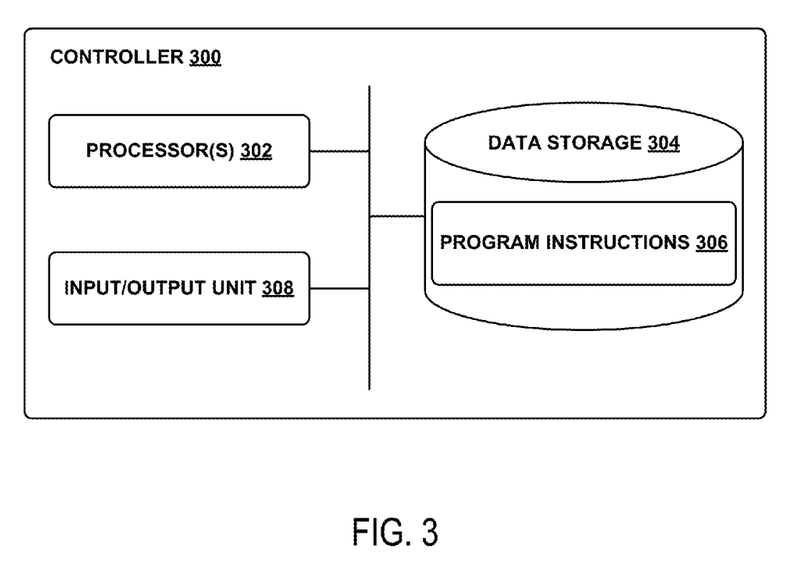
FIG. 3 depicts a block diagram of a controller for a 3D plasma printing system, according to an example embodiment.

The gas supply 140, power supply 160, material supply 150, and one or more motors 170 may be coupled to the controller 180 to facilitate their operation in accordance with the methods and processes disclosed herein, as discussed in more detail below with respect to FIG. 3.

Figure 2:
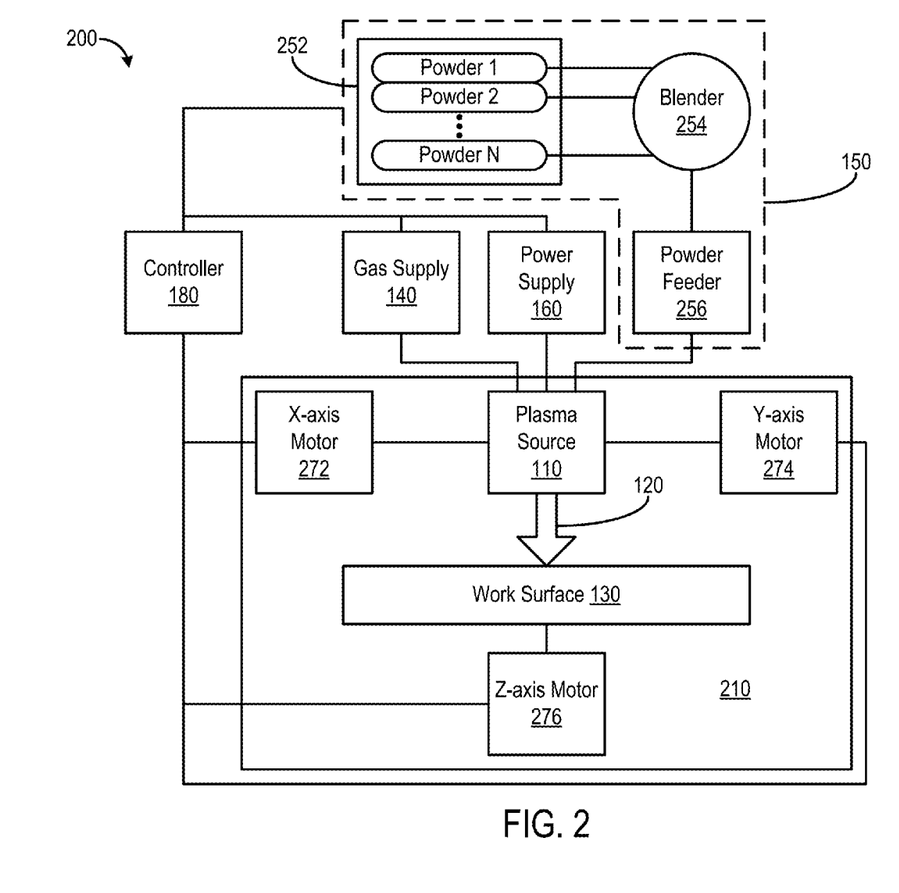
FIG. 2 depicts a block diagram of a 3D plasma printing system, according to an example embodiment.

FIG. 2 depicts a block diagram of another 3D plasma printing system 200 according to an example embodiment. The 3D plasma printing system 200 is similar to 3D plasma printing system 100, however 3D plasma printing system 200 includes a pressurized housing 210 and illustrates the material supply 150 and one or more motors 170 in more detail.

As depicted in FIG. 2, the plasma source 110 and the work surface 130 may be located in a pressurized housing 210. The pressurized housing 210 may be any container, such as a vacuum chamber, capable of containing a pressurized gas. The pressurized housing 210 may receive gas from the gas supply 140 and may be coupled to a pump (not shown). In some embodiments, the pump may be configured to pump gas into the pressurized housing 210 at a pressure above atmospheric pressure (e.g., above 760 mTorr). In some embodiments, the pump may be configured to pump gas out of the pressurized housing 210 at a pressure below atmospheric pressure (e.g., below 760 mTorr).

As further depicted in FIG. 2, the material supply 150 may include a hopper 252. The hopper 252 may contain a number of cartridges, each cartridge capable of containing a different powdered printing material and/or powdered printing materials of different colors and/or textures. Powdered printing material from one or more of the cartridges may be fed from the hopper 252 into a blender 254. The blender 254 may blend the powdered printing materials from the hopper 252 to create a mixture of powdered printing materials. The mixed powder may be transported from the blender 254 to the plasma source 110 by a powder feeder 256.

The powder feeder 256 may be any commercial or proprietary powder feeder capable of adding the powdered printing material to the plasma at a consistent rate without agglomeration, such as the FST PF-50 powder feeder. The powder feeder 256 may use gravity as well as pressurized gas to deliver the powdered printing material to the plasma source 110. In the powder feeder 256, powdered printing material may be fed from a hopper to a gas fluidization area. A carrier gas may pass through the fluidization area, fluidizing the printing material and transporting the fluidized printing material to the plasma source 110. In some embodiments, the carrier gas may be the same gas as the ionized plasma gas in the plasma source 110 from the gas supply 140. The flow rate of the powdered printing material supplied to the plasma source 110 may be increased by increasing the differential pressure of the carrier gas to the fluidization area.

The powder feeder 256 may transport the fluidized powdered printing material to the plasma source 110 through a probe. The probe may be configured to add the powdered printing material to the plasma inside the plasma source 110 and/or to the plasma jet 120 outside the plasma source 110. The probe may be a liquid-cooled probe, such as a water-cooled probe. In some embodiments, more than one probe may be used to simultaneously transport more than one powdered printing material to the plasma.

As further depicted in FIG. 2, the one or more motors 170 may include an x-axis motor 272 and a y-axis motor 274 coupled to the plasma source 110 and a z-axis motor 276 coupled to the work surface 130. The x-axis motor 272 may be configured to move the plasma source 110 along an x-axis parallel to the work surface 130, the y-axis motor 274 may be configured to move the plasma source 110 along a y-axis parallel to the work surface 130, and the z-axis motor 276 may be configured to move the work surface 130 along a z-axis perpendicular to the work surface 130. The z-axis motor 276 may further be configured to rotate the work surface 130 around the z-axis.

In order to carry out the methods, processes, or functions disclosed in this specification or the accompanying drawings, the controller 180 may include computing device components. FIG. 3 depicts an example embodiment 300 of computing device components (e.g., functional elements of a computing device) that may be included in the controller 180.

The controller computing device components 300 may include one or more processors 302, data storage 304, program instructions 306, and an input/output unit 308, all of which may be coupled by a system bus or a similar mechanism. The one or more processors 302 may include one or more central processing units (CPUs), such as one or more general purpose processors and/or one or more dedicated processors (e.g., application specific integrated circuits (ASICs) or digital signal processors (DSPs), etc.). The one or more processors 302 can be configured to execute computer-readable program instructions 306 that are stored in the data storage 304 and are executable to provide at least part of the functionality described herein.

The data storage 304 may include or take the form of one or more computer-readable storage media that may be read or accessed by at least one of the one or more processors 302. The one or more computer-readable storage media can include volatile and/or non-volatile storage components, such as optical, magnetic, organic, or other memory or disc storage, which may be integrated in whole or in part with at least one of the one or more processors 302. In some embodiments, the data storage 304 may be implemented using a single physical device (e.g., one optical, magnetic, organic, or other memory or disc storage unit), while in other embodiments, the data storage 304 may be implemented using two or more physical devices.

The input/output unit 308 may include user input/output devices, network input/output devices, and/or other types of input/output devices. For example, input/output unit 308 may include user input/output devices, such as a touch screen, a keyboard, a keypad, a computer mouse, liquid crystal displays (LCD), light emitting diodes (LEDs), displays using digital light processing (DLP) technology, cathode ray tubes (CRT), light bulbs, and/or other similar devices. Network input/output devices may include wired network receivers and/or transceivers, such as an Ethernet transceiver, a Universal Serial Bus (USB) transceiver, or similar transceiver configurable to communicate via a twisted pair wire, a coaxial cable, a fiber-optic link, or a similar physical connection to a wireline network, and/or wireless network receivers and/or transceivers, such as a Bluetooth transceiver, a Zigbee transceiver, a Wi-Fi transceiver, a WiMAX transceiver, a wireless wide-area network (WWAN) transceiver and/or other similar types of wireless transceivers configurable to communicate via a wireless network.

The controller computing device components 300 may be implemented in whole or in part in various components of the 3D plasma printing systems depicted in FIGS. 1 and 2 and/or in at least one device remotely located from the 3D plasma printing systems, such as a workstation or personal computer. Generally, the manner in which the controller 180 is implemented may vary, depending upon the particular application.

In order to fabricate a 3D object, a computing device, such as the controller 180, may be provided with 3D object data indicative of the 3D object to be printed. The 3D object data may indicate various physical dimensions of the 3D object, such that the 3D object data is representative of a physical volume of space that will be occupied by the printed 3D object.

In some embodiments, the 3D object data may be generated by a 3D scanner. A 3D scanner may analyze a real-world object to collect data on its shape and/or appearance. For example, some 3D scanners, such as coordinate measuring machines, may probe the real-world object with physical touch to generate 3D object data. Other 3D scanners (e.g., time-of-flight laser scanners, triangulation laser scanners, conoscopic systems, structured light scanners, modulated light scanners, etc.) may emit some kind of radiation or light and detect its reflection or the radiation passing through the real-world object. And other 3D scanners that employ, for example, stereoscopic systems, photometric systems, or silhouette techniques, among others, do not emit any kind of radiation themselves, but instead rely on detecting reflected ambient radiation.

In some embodiments, the 3D object data may be generated from scratch through, for example, a computer-aided design (CAD) software. It should be understood that generation of the 3D object data is not limited to the methods disclosed herein, rather any conventional methods may be used to generate the 3D object data.

In some embodiments, the 3D object data may be scaled to increase or decrease the size of the printed 3D object. Further, the 3D object data may be divided into subparts, each of the subparts corresponding to a piece of the 3D object, which may be fabricated by assembling the printed pieces. This may allow fabrication of more complex and/or larger 3D objects than the 3D plasma printing system may otherwise be capable of fabricating.

The controller 180 may parse the 3D object data representing the entire 3D object into 3D object data representing a number of cross-sectional planar slices of the 3D object. The number of slices may depend on the desired thickness of each cross-sectional slice as well as the resolution capabilities of the 3D plasma printing system. The resolution of the 3D plasma printing system represents how thin each layer of printing material deposited by the printing system is. The resolution may be used to determine the dimensions of the planar slices of the 3D object. For example, the controller 180 may parse the 3D object data into planar slices with a thickness equal to or greater than a minimum thickness. The minimum thickness may depend on a processing time, a flow rate of the powder from the material supply 150, and/or a particle size of the powder added to the plasma. For example, a typical particle size of the powder may be 5 to 500 microns, and a typical resolution may be 1 to 500 microns.

To fabricate the 3D object, the 3D plasma printing system may be configured to deposit successive layers of printing material on top of one another on the work surface, each of the successive layers corresponding to one of the number of planar slices of the 3D object.

In some embodiments, the 3D object data may further include data indicating a color or material of all or part of the 3D object to be printed. Based on this data, the controller 180 may select one or more powdered printing materials of a corresponding color or material from the material supply 150 to be deposited on the work surface 130 as all or part of one or more of the cross-sectional planar slices of the 3D object.

Figure 4:
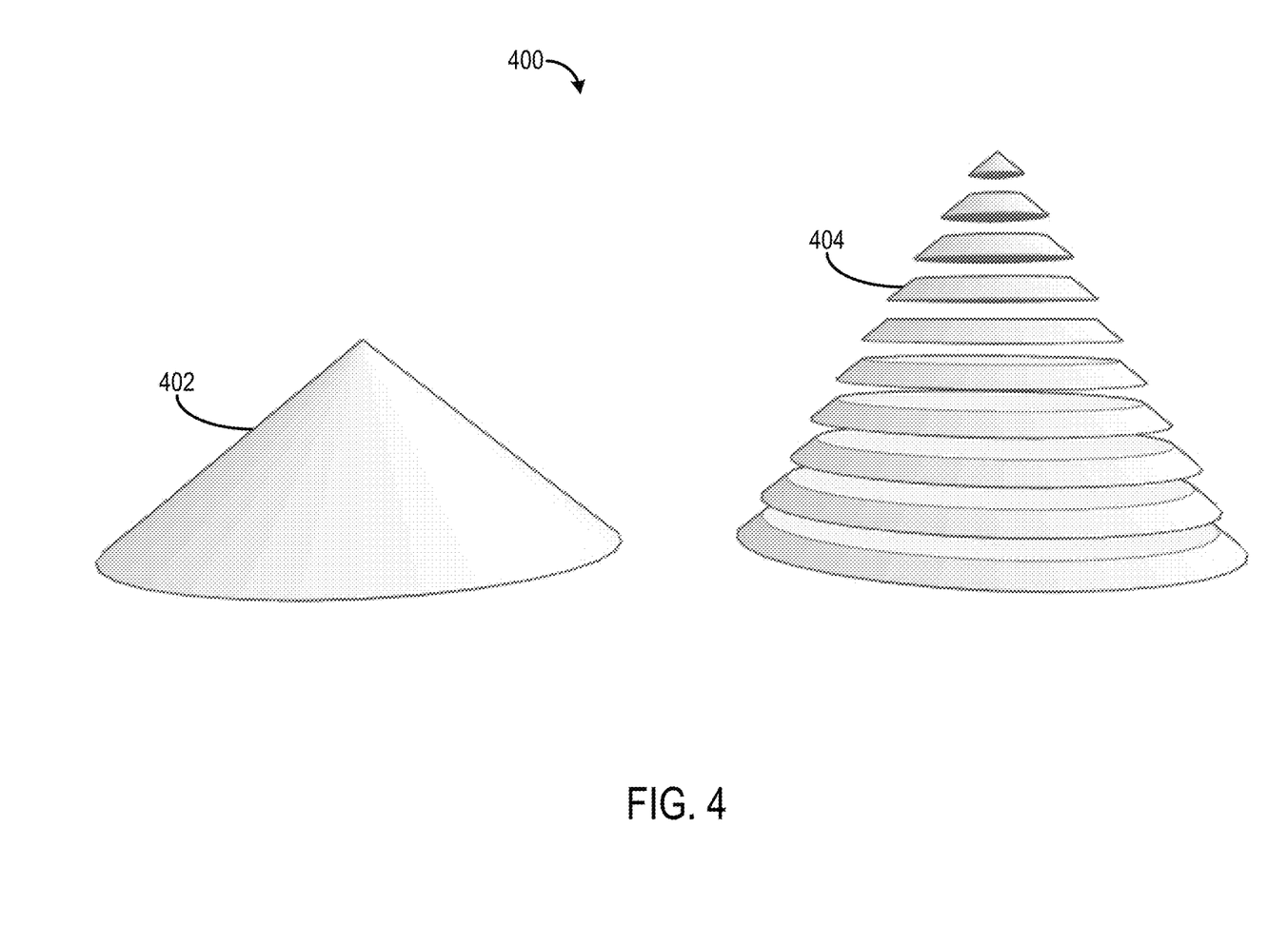
FIG. 4 depicts a 3D object and its cross-sectional planar slices fabricated by a 3D plasma printing system, according to an example embodiment.

FIG. 4 depicts an example embodiment 400 of a 3D object 402 and a number of cross-sectional planar slices 404 of the 3D object 402 printed by a 3D plasma printing system. As depicted in FIG. 4, the 3D object 402 may take on various forms, such as a cone. To fabricate the cone 402, the controller 180 may be provided with 3D object data indicative of the cone 402. The 3D object data may indicate various physical dimensions of the cone 402, such as its height and the radius of its base. Based on the physical dimensions of the cone 402, the controller 180 may parse the 3D object data into data representing the cross-sectional planar slices 404. The controller 180 may control the one or more motors 170 to adjust the relative position of the plasma jet 120 and the work surface 130 so that printing material is added to the plasma and deposited on the work surface in patterns corresponding to each of the slices 404. By depositing the printing material on the work surface 130 in successive layers, one on top of another, the 3D plasma printing system may fabricate the cone 402.

Figure 5:
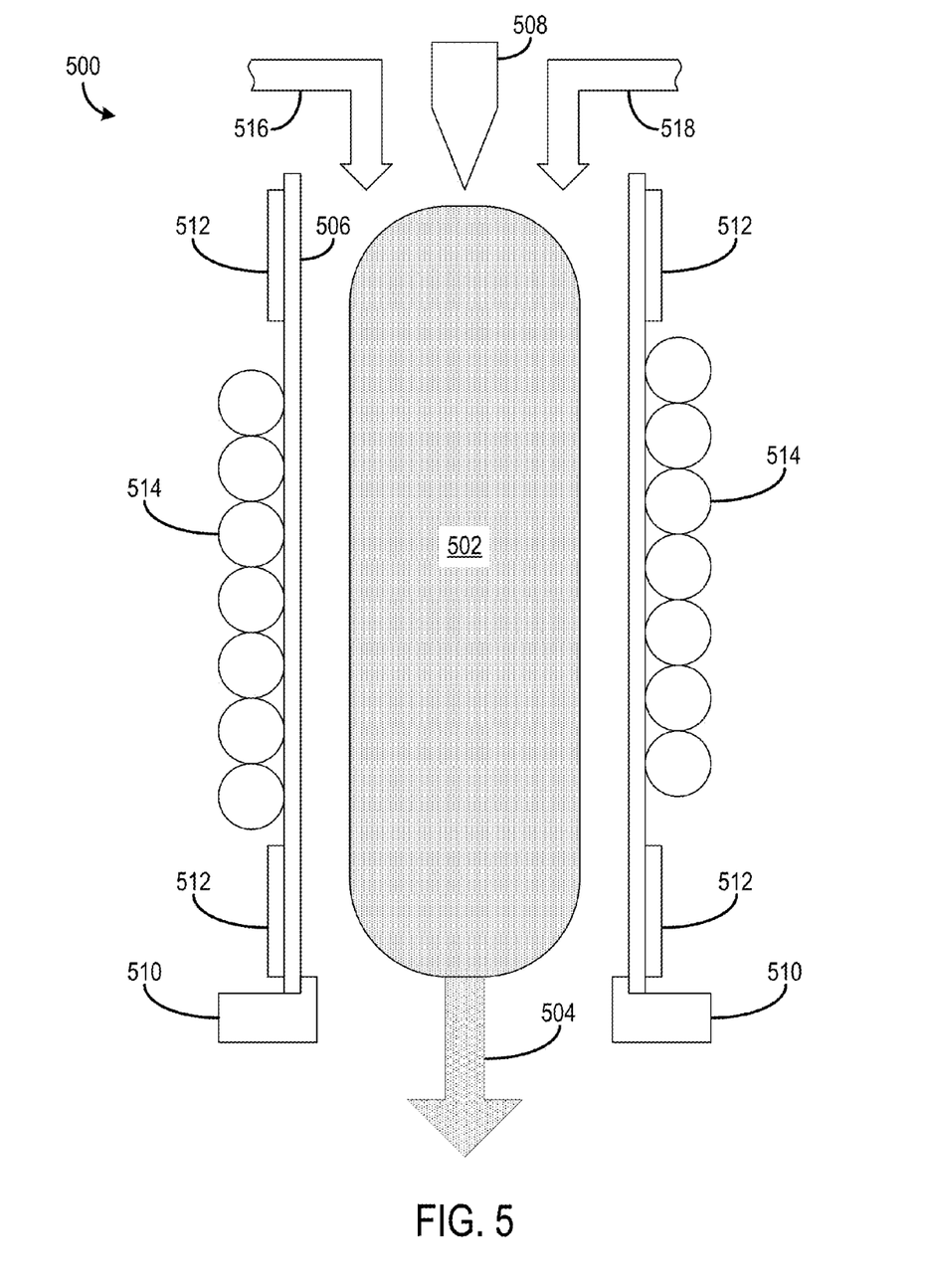
FIG. 5 depicts a plasma source of a 3D plasma printing system, according to an example embodiment.

FIG. 5 depicts a cross-sectional view of a plasma source 500 of a 3D plasma printing system, according to an example embodiment. The plasma source 500 may take the form of or be similar in form to the plasma source 110 depicted in FIGS. 1 and 2. The plasma source 500 may be configured to generate a plasma 502 and accelerate the plasma 502 out of the plasma source 500 as a plasma jet 504 and may include a housing 506, an anode 508, a cathode 510, capacitive electrodes 512, a coil 514, a gas inlet 516, and a printing material inlet 518.

The plasma source 500 may generate the plasma 502 within the housing 506. The housing 506 may be made of any non-conductive material, such as quartz, a ceramic, or some other dielectric material. The anode 508 and cathode 510 may be located inside the housing 506 at or near opposing ends of the housing 506. The capacitive electrodes 512 may be located on the outside surface of the housing 506 at or near opposing ends of the housing 506. The coil 514 may be wound around the length of the housing 506 on the outside surface of the housing 506 between the capacitive electrodes 512.

Gas may flow into the housing 506 through the gas inlet 516. The gas may be provided by a gas supply, such as the gas supply 140 depicted in FIGS. 1 and 2, and may include a noble gas, oxygen, nitrogen, air, a reduced gas, or any other gas suitable for generating a plasma. As depicted in FIG. 5, the gas inlet 516 may be located at or near the end of the housing 506 opposite the plasma jet 504. In some embodiments, the gas inlet 516 may provide gas to the housing 506 at various other locations.

The gas supplied to the housing 506 may be ionized by coupling the various electrodes 508-514 to a power supply (not shown), such as the power supply 160 depicted in FIGS. 1 and 2. The power supply may provide a DC voltage bias across the anode 508 and cathode 510. By configuring the DC voltage bias to be sufficiently large and/or by varying the pressure of the gas in the housing 506, the electric field between the anode 508 and cathode 510 may ionize the gas, generating a DC arc plasma.

The power supply may further provide a radio frequency (RF) signal across the capacitive electrodes 512. The capacitive electrodes 512 may be capacitively coupled to the plasma 502. The RF signal across the capacitive electrodes 512 exposes the electrons and ions in the plasma 502 to a time-varying electric field, causing the particles to oscillate back and forth between the capacitive electrodes 512. The oscillations result in particle collisions that further ionize the gas, generating a capacitively coupled plasma.

Similarly, the power supply may further provide an RF signal to the coil 514. The RF signal across the coil 514 exposes the electrons and ions in the plasma 502 to a time-varying magnetic field, which in turn induces an azimuthal electric field in the gas. This causes electrons in the gas to travel in figure-eight trajectories, resulting in particle collisions that further ionize the gas and generating an inductively coupled plasma.

In some embodiments, the plasma source 500 may be configured to only generate one of a DC arc plasma, a capacitively coupled plasma, or an inductively coupled plasma. In some embodiments, the plasma source 500 may be configured to generate a combination of two or all three of a DC arc plasma, a capacitively coupled plasma, and an inductively coupled plasma.

The plasma source 500 may be further configured to accelerate a portion of the generated plasma out of the plasma source 500 in a plasma jet 504. As depicted in FIG. 5, the cathode 510 may include an opening, and the electric field between the anode 508 and cathode 510 may accelerate the plasma 502 through the opening, forming the plasma jet 504.

Printing material may be added to the plasma 502 through the printing material inlet 518. The printing material may be provided by a material supply, such as the material supply 150 depicted in FIGS. 1 and 2. As discussed above, the printing material may take the form of a powder and may include various materials, such as ceramics (e.g., aluminum oxide, zirconium oxide stabilized by yttrium oxide or calcium oxide, silicon dioxide, etc.), metals (e.g., tungsten, titanium, molybdenum, etc.), composite materials (e.g., tungsten carbide-cobalt, titanium carbide, etc.), and/or any combination thereof. The printing material may take other forms as well, such as gases used for plasma-assisted deposition (e.g., $H_2$ and $CH_4$ for diamond deposition). The printing material inlet 518 may be configured to receive more than one printing material at a time through one or more liquid-cooled probes.

As depicted in FIG. 5, the printing material inlet 518 may be located at the end of the plasma source 500 opposite the plasma jet 504. However, in some embodiments, the printing material inlet 518 may be located at various locations along the length of the plasma source 500.

For powdered printing materials, the temperature of the plasma 502 may be configured to be higher than a melting temperature of the printing material. The temperature of the plasma 502 may be varied by adjusting the power delivered to the plasma 502, for example, by increasing the voltage supplied to the various electrodes 508-514 or by varying the pressure of the gas within the housing 506. In some embodiments, the plasma 502 may have a temperature that is variable between 300 K and 6,000 K.

By configuring the temperature of the plasma 502 to be higher than the melting temperature of the printing material, the printing material may be melted when it is added to the plasma 502 through the printing material inlet 518. The melted printing material may be accelerated out of the plasma source 500 along with the plasma 502 in the plasma jet 504.

Figure 6:
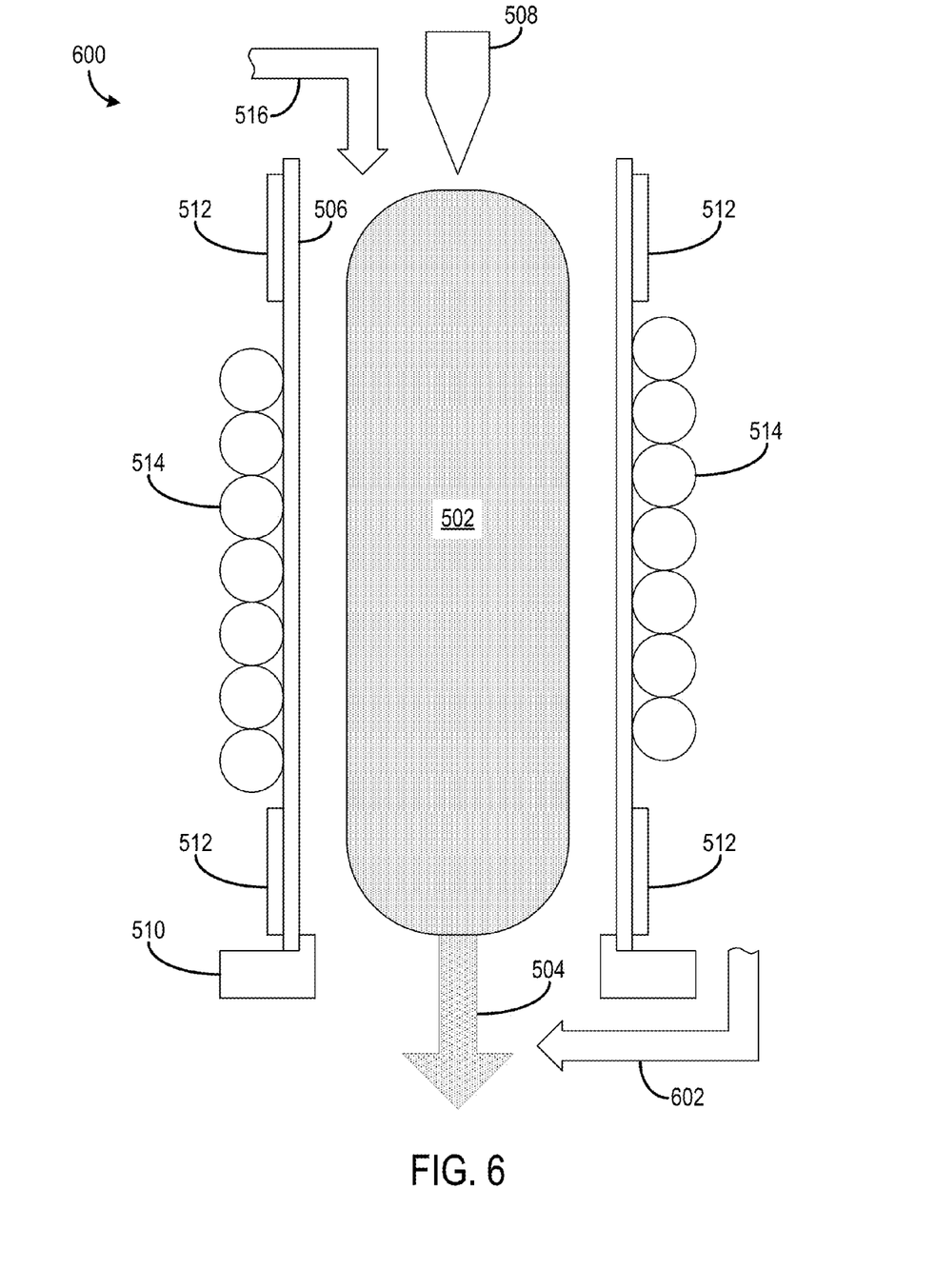
FIG. 6 depicts a plasma source of a 3D plasma printing system, according to an example embodiment.

FIG. 6 depicts a plasma source 600 of a 3D plasma printing system, according to an example embodiment. The plasma source 600 is similar to plasma source 500, however plasma source 600 includes a printing material inlet 602 configured to add printing material directly to the plasma jet 504. Similar to the plasma source 500 depicted in FIG. 5, the printing material may be supplied to the printing material inlet 602 by a material supply, such as the material supply 150 depicted in FIGS. 1 and 2. The printing material inlet 602 may be configured to receive more than one printing material at a time through one or more liquid-cooled probes.

Figure 7:
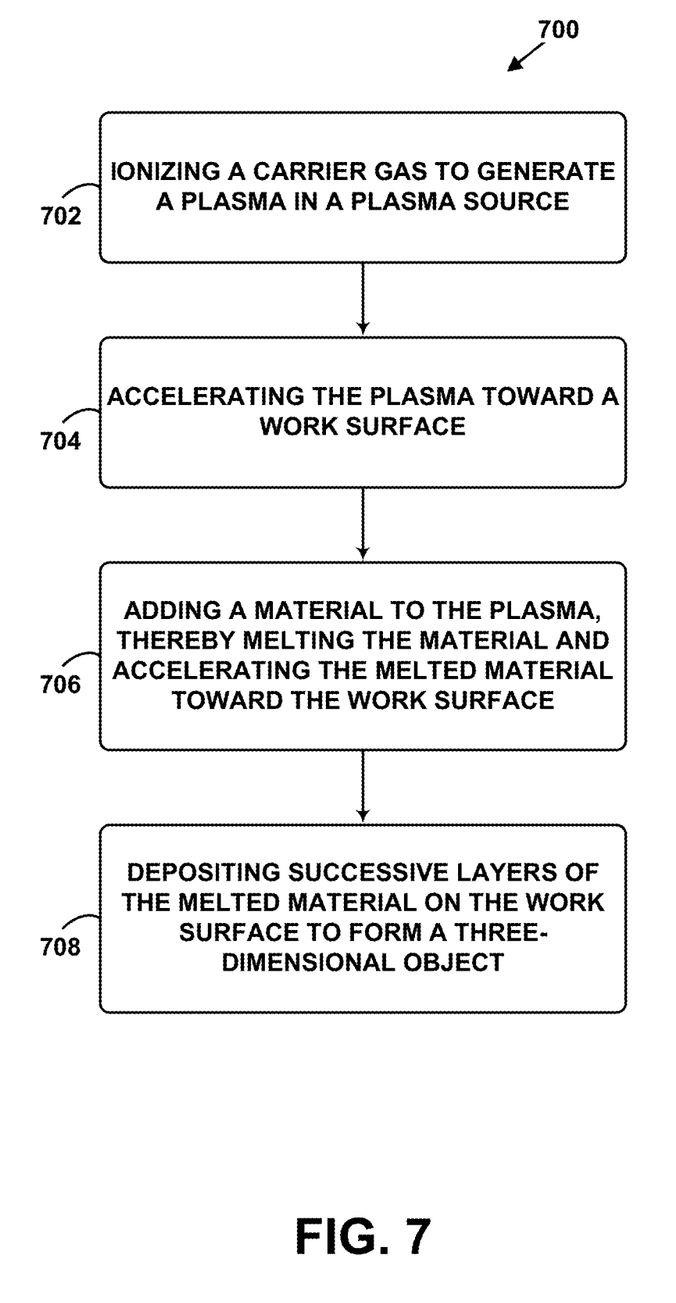
FIG. 7 depicts a flowchart of a method, according to an example embodiment.

FIG. 7 depicts a flowchart of an example method 700 that could be used to print a 3D object. The example method 700 may include one or more operations, functions, or actions, as depicted by one or more of blocks 702, 704, 706, and/or 708, each of which may be carried out by any of the systems described by way of FIGS. 1-6; however, other configurations could be used as well.

Furthermore, those skilled in the art will understand that the flowchart described herein illustrates functionality and operation of certain implementations of example embodiments. In this regard, each block of the flow diagram may represent a module, a segment, or a portion of program code, which includes one or more instructions executable by a processor for implementing specific logical functions or steps in the process. The program code may be stored on any type of computer readable medium, for example, such as a storage device including a disk or hard drive. In addition, each block may represent circuitry that is wired to perform the specific logical functions in the process. Alternative implementations are included within the scope of the example embodiments of the present application in which functions may be executed out of order from that shown or discussed, including substantially concurrent or in reverse order, depending on the functionality involved, as would be understood by those reasonably skilled in the art.

Method 700 begins at block 702, which includes ionizing a plasma gas to generate a plasma in a plasma source. The plasma gas may include a noble gas, oxygen, nitrogen, air, a reduced gas, or any other gas suitable for generating the plasma. The plasma source may include an anode and cathode for generating a DC arc plasma, capacitive electrodes for generating a capacitively coupled plasma, and/or a coil for generating an inductively coupled plasma.

Method 700 continues at block 704, which includes accelerating the plasma toward a work surface. An electric field resulting from a voltage bias across the anode and cathode of the plasma source may accelerate the plasma through an opening in the cathode, forming a plasma jet. The plasma source may be positioned above the work surface so the work surface is exposed to the plasma jet.

Method 700 continues at block 706, which includes adding a material to the plasma, thereby melting the material and accelerating the melted material toward the work surface. The material may take the form of a powder and may include various materials, such as ceramics (e.g., aluminum oxide, zirconium oxide stabilized by yttrium oxide or calcium oxide, silicon dioxide, etc.), metals (e.g., tungsten, titanium, molybdenum, etc.), composite materials (e.g., tungsten carbide-cobalt, titanium carbide, etc.), and/or any combination thereof. The material may take other forms as well, such as gases used for plasma-assisted deposition (e.g., $H_2$ and $CH_4$ for diamond deposition). The material may be added to the plasma within the plasma source, and/or the material may be added to the plasma jet outside the plasma source.

Method 700 continues at block 708, which includes depositing successive layers of the melted material on the work surface to form a 3D object. Each of the successive layers may correspond with a planar slice of the 3D object. By depositing the successive layers on top of one another, the 3D object may be formed with the printing material.

In addition to the operations depicted in FIG. 7, other operations may be utilized with the example 3D plasma printing systems presented herein.

III. Conclusion

The particular arrangements shown in the Figures should not be viewed as limiting. It should be understood that other embodiments may include more or less of each element shown in a given Figure. Further, some of the illustrated elements may be combined or omitted. Yet further, an exemplary embodiment may include elements that are not illustrated in the Figures.

Additionally, while various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are contemplated herein.

What is claimed is:

1. A method comprising:
    receiving three-dimensional object data indicative of a three-dimensional object to be printed;
    parsing the three-dimensional object data into cross-section object data indicative of a plurality of planar slices of the three-dimensional object;
    ionizing a plasma gas to generate a plasma in a plasma source;
    accelerating the plasma toward a work surface;
    adding a material to the plasma, thereby melting the material and accelerating the melted material toward the work surface; and
    depositing successive layers of the melted material on the work surface to form the three-dimensional object, each of the successive layers corresponding to one of the plurality of planar slices of the three-dimensional object.

2. The method of claim 1, wherein the material comprises a material selected from the group consisting of a ceramic powder, a metal powder, and a composite material powder.

3. The method of claim 1, wherein the material comprises a first powder and a second powder, wherein the first and second powders are blended before adding the material to the plasma.

4. The method of claim 1, wherein adding the material to the plasma comprises:
    fluidizing the material with the carrier gas; and
    feeding the fluidized material to the plasma through a liquid-cooled probe.

5. The method of claim 4, wherein the fluidized material is added to the plasma inside the plasma source.

6. The method of claim 4, wherein the fluidized material is added to the plasma outside the plasma source into a plasma jet.

7. The method of claim 4, wherein the liquid-cooled probe comprises a water-cooled probe.

8. The method of claim 1, further comprising, prior to adding the material to the plasma, exposing the work surface to the plasma to etch the work surface.

9. The method of claim 1, wherein the plasma comprises inductively coupled plasma.

10. The method of claim 1, wherein the plasma comprises capacitively coupled plasma.

11. The method of claim 1, wherein the plasma comprises direct current arc plasma.

12. The method of claim 1, wherein the plasma has a temperature that is variable between 300 kelvin and 6,000 kelvin.

13. A system comprising:
    a work surface;
    a plasma source configured to generate a plasma by ionizing a plasma gas and to accelerate the plasma toward the work surface;
    a feeder configured to add a material to the plasma, wherein the material is melted and accelerated toward the work surface; and
    a controller configured to: (i) receive three-dimensional object data indicative of a three-dimensional object to be printed, (ii) parse the three-dimensional object data into cross-section object data indicative of a plurality of planar slices of the three-dimensional object, and (iii) adjust the relative position of the plasma to the work surface to deposit successive layers of the melted material on the work surface, each of the successive layers corresponding to one of the plurality of planar slices of the three-dimensional object.

14. The system of claim 13, wherein the plasma source is further configured to etch the work surface by exposing the work surface to the plasma prior to the feeder adding the material to the plasma.

15. A printing apparatus for fabricating a three-dimensional object, the apparatus comprising:
    a first inlet configured to receive a plasma gas;
    a plasma source configured to ionize the plasma gas to generate a plasma, wherein the plasma source comprises one or more of (i) an anode and cathode configured to generate a direct current arc plasma, (ii) a coil configured to generate an inductively coupled plasma, or (iii) capacitive electrodes configured to generate a capacitively coupled plasma, wherein the plasma source is further configured to accelerate the plasma toward a work surface;
    a second inlet configured to receive a powdered printing material and add the powdered printing material to the plasma, wherein the powdered printing material is melted and accelerated toward the work surface; and
    a controller configured to: (i) receive three-dimensional object data indicative of a three-dimensional object to be printed, (ii) parse the three-dimensional object data into cross-section object data indicative of a plurality of planar slices of the three-dimensional object, and (iii) adjust the relative position of the plasma to the work surface to deposit successive layers of the melted material on the work surface, each of the successive layers corresponding to one of the plurality of planar slices of the three-dimensional object.

16. The apparatus of claim 15, wherein the plasma gas comprises a noble gas.

17. The apparatus of claim 15, wherein the plasma gas comprises oxygen.

18. The apparatus of claim 15, wherein the plasma gas comprises a reduced gas.

19. The apparatus of claim 15, wherein the apparatus is contained within a pressurized housing, wherein the housing is pressurized at a pressure below atmospheric pressure.

20. The apparatus of claim 15, wherein the apparatus is contained within a pressurized housing, wherein the housing is pressurized at atmospheric pressure.

21. The apparatus of claim 15, wherein the apparatus is contained within a pressurized housing, wherein the housing is pressurized at a pressure above atmospheric pressure.

* * * * *